United States Patent [19]

Iwasa et al.

[11] Patent Number: 5,887,128
[45] Date of Patent: Mar. 23, 1999

[54] METHOD AND APPARATUS FOR REDUNDANT DISK STORAGE SYSTEM WITH OFFSET

[75] Inventors: Hiroyuki Iwasa; Hiroaki Okumiya; Akira Takeshita; Makoto Tsurumi, all of Fujisawa, Japan

[73] Assignee: International Business Machines Corporation, Armonk, N.Y.

[21] Appl. No.: 775,060

[22] Filed: Dec. 27, 1996

Related U.S. Application Data

[63] Continuation of Ser. No. 421,643, Apr. 13, 1995, abandoned.

[30] Foreign Application Priority Data

Apr. 14, 1994 [JP] Japan ..................................... 6-076213

[51] Int. Cl.$^6$ ....................................................... G06F 11/00
[52] U.S. Cl. ....................................................... 395/182.04
[58] Field of Search ........................... 395/182.4, 182.05, 395/181, 182.13, 183.01, 183.03, 184.01, 185.01

[56] References Cited

U.S. PATENT DOCUMENTS

| | | | |
|---|---|---|---|
| 4,783,705 | 11/1988 | Moon et al. ............................... | 360/77 |
| 5,075,805 | 12/1991 | Peddle et al. ............................. | 360/61 |
| 5,127,088 | 6/1992 | Takaki ..................................... | 395/275 |
| 5,128,810 | 7/1992 | Halford .................................... | 360/39 |
| 5,148,432 | 9/1992 | Gordon et al. .......................... | 371/10.1 |
| 5,191,584 | 3/1993 | Anderson ................................ | 371/51.1 |
| 5,241,668 | 8/1993 | Eastridge et al. ....................... | 395/575 |
| 5,329,510 | 7/1994 | Tsuyuguchi et al. .................... | 369/47 |
| 5,371,882 | 12/1994 | Ludlam .................................... | 395/575 |
| 5,388,085 | 2/1995 | Jaquette ................................... | 369/32 |
| 5,418,925 | 5/1995 | DeMos et al. ........................... | 395/425 |
| 5,463,758 | 10/1995 | Ottesen .................................... | 395/441 |

FOREIGN PATENT DOCUMENTS

| | | | |
|---|---|---|---|
| 0266586 | 5/1988 | European Pat. Off. ........ | G11B 27/00 |
| 8403689 | 7/1986 | Netherlands ................... | G11B 20/10 |

OTHER PUBLICATIONS

Performance Evaluation, vol. 20, No. 1–3, May 1994, pp. 97–114, entitled "Minimizing Mean Seek Distance in Mirrored Disk Systems By Cylinder Remapping" by R. Geist et al.

ACM Transactions of Computer Systems, vol. 8, No. 3, Aug. 1990, pp. 214–229, entitled "Disk Arm Movement in Anticipation of Future Requests" by Richard P. King.

Sigmond Record, vol. 22, No. 2, Jun. 1993, pp. 307–316, entitled "Doubly Distorted Mirrors" by Cyril U. Orji et al.

*Primary Examiner*—Hoa T. Nguyen
*Attorney, Agent, or Firm*—Richard E. Billion; Karuna Ojanen

[57] ABSTRACT

A redundant disk storage system having data stored on one disk and identical data on second disk, wherein the data stored on the second disk is in a different radial location determined by an offset. The offset could be such that the data on the first disk is stored near the inner circumference and the identical data is stored on the second disk near the outer circumference. Moreover, a RAM associated with each disk drive which stores the address and offset eliminates a RAM in the main disk controller.

10 Claims, 7 Drawing Sheets

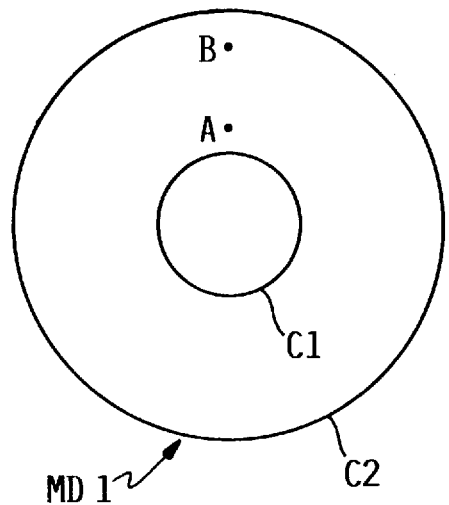
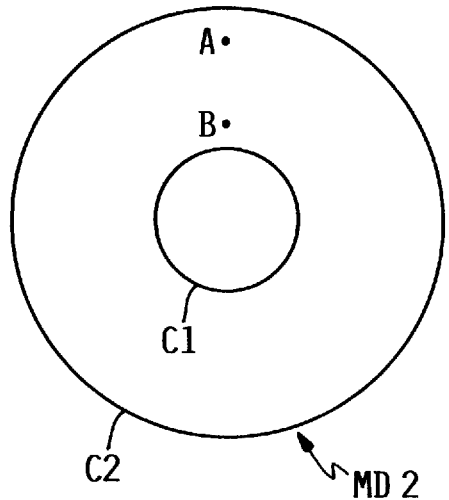
FIG. 4A  FIG. 4B
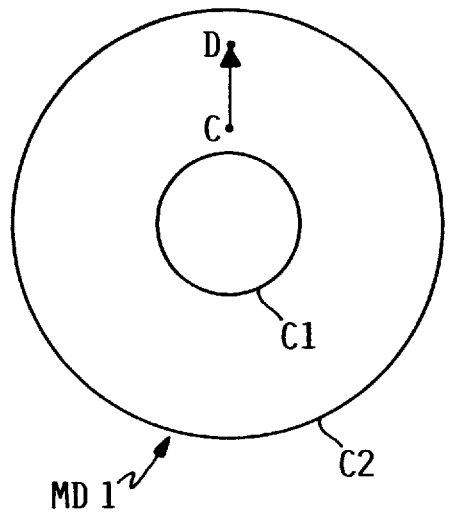
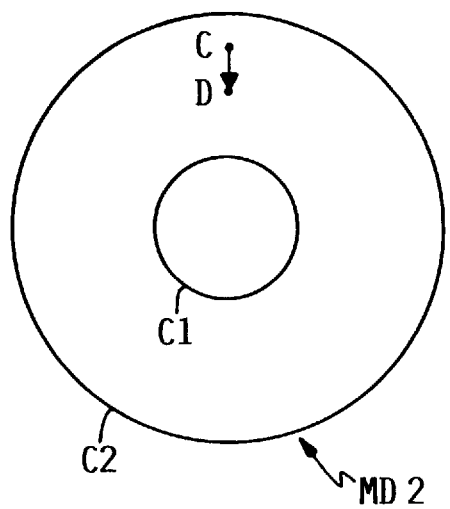
FIG. 5A  FIG. 5B

METHOD AND APPARATUS FOR REDUNDANT DISK STORAGE SYSTEM WITH OFFSET

This application is a continuation of the application Ser. No. 08/421,643, filed on Apr. 13, 1995, now abandoned.

FIELD OF THE INVENTION

The present invention relates to a redundant disk storage system and, more particularly, to a redundant disk storage system for recording data identical to data transferred from a host computer in each of a pair of hard disk drives and reading data from one of the pair of drives and transferring read data to the host computer.

BACKGROUND OF THE INVENTION

A hard disk drive for recording data on a magnetic disk which is a magnetic recording medium for recording and reading data is an essential device for storing large amounts of data and programs in computer systems. Since a hard disk drive contains moving mechanical parts, a failure is relatively liable to occur. Such a failure may prevent the hard disk drive from reading or storing data and programs which, in turn, may stop the entire computer system using the drive.

To prevent the consequences of such a loss, a multiplexed disk recording controller (redundant disk array) for multiplexing the hard disk drive and recording data, etc., in the multiplexed hard disk drive based on a command from a host computer and reading data, etc., from the multiplexed hard disk drive has already been proposed. The multiplexed disk controller is provided with a redundant array of independent disks (RAID), e.g., RAID 0, RAID 1, RAID 3, and RAID 5. RAID 0, RAID 3, and RAID 5 each divide data among a plurality of hard disk drives. RAID 1 records data on two hard disk drives redundantly.

In the multiplexed disk recorder to which RAID 1 is applied (hereafter redundant disk storage system), identical data and programs are stored on two hard disk drives at all times. Redundancy is given so that, if a failure occurs in one hard disk drive, data reading, etc., can be done using the remaining drive.

The redundant disk storage system processes data when it receives a data recording command or a write command from a host computer; that is, a write command or parameter received from a host computer is sent to the first hard disk drive, then also sent to the second hard disk drive. When both drives can transfer and record data (data-transfer-enabled), data from the host computer is simultaneously sent to the pair of drives, thereby recording sent data on both magnetic disks of the pair of drives.

Moreover, the redundant disk storage system processes data by either a first or second method described as follows; when it receives a data read command (read command) from a host computer.

In the first method, a read command is sent to only one of a pair of hard disk drives, and processing waits until the hard disk drive to which this read command is sent is able to read data (read-enabled possible). When this drive is read-enabled, to read data, information indicating read-enabled is sent to the host computer and the required data is transferred from the hard disk drive to the host computer.

In this method, the control program is simple, but a long time is required for authorizing a failure in the hard disk drive in which a read command is received, and, moreover, a read command must be sent to the remaining hard disk drive after failure authorization. Therefore, if a failure occurs in either drive, a long time is required from read command receiving to the completion of magnetic disk data reading.

In the second method, both of a pair of hard disk drives are issued a read command and required data is transferred from whichever one of the pair of drives becomes data-transfer-enabled first.

Use of this method shortens the read time upon a failure in a hard disk drive compared to the first method because, even for a failure in either hard disk drive, only one of the pair of drives must be able to transfer data. However, in this method, if necessary data is recorded near the internal circumference on the hard disk, the read voltage of data read by the magnetic head is low and data may not be recognized in some cases. Therefore, the drive itself must repeat a retry to read data or the redundant disk storage system must retry sending a parameter or command to the drive again, if necessary. Retry by the drive itself or the redundant disk storage system eventually enables data to be read. Therefore, if required data is recorded near the internal circumference on the hard disk, the probability of not reading data rises or a long read time is needed.

Moreover, using the first or second method in a redundant disk storage system, read heads of the two hard disk drives are both positioned where said data is recorded or at the first position at the end of the first data reading. Therefore, the first and the second methods do not differ greatly in the time for movement from the location of data previously recorded to that of required data.

Moreover, in the conventional redundant disk storage system, it was difficult to incorporate a hard disk drive in a computer, e.g., a personal computer, because of increased scale accompanied by increased recording capacity. Therefore, at least one hard disk drive was connected externally. Where a hard disk drive was installed outside the computer, the interface of the hard disk drive had to be connected with a cable. In this case, to avoid malfunctioning due to noise, a small computer system interface (SCSI) suitable for an external hard disk drive was generally used to connect the redundant disk controller and a pair of hard disk drives, thereby making the data capacities of tens of G bytes possible.

In contrast, the AT interface was generally used in personal computers having a small built-in hard disk drive. However, an AT interface was not used in the redundant disk drive because the maximum capacity of a hard disk drive which can be used by a host with which an AT interface is connected was limited to 528 M bytes because of basic input and output system (BIOS) restrictions.

However, large-capacity hard disk drives have been downsized rapidly by the development of an magneto-respective head and other technology. It has become possible to manufacture even a 3.5-inch hard disk drive having a capacity exceeding G bytes which can be built into personal computers. Moreover, with the addition of ATA specifications by ANSI, it has become possible for BIOS to access a large capacity (the same level as for a small computer system interface (SCSI) hard disk drive with an AT interface. Accordingly, the necessity of mirroring is increasing rapidly even in small hard disk drives used for personal computers.

In this connection, in the redundant disk controller connected to a host computer having an AT interface, internal data RAM was needed. This is because synchronization timing between the host and hard disk drive is difficult and a consecutive transfer of 256 words of data was needed for processing an Identify Drive command. That is, the Identify Drive command is executed once for initialization immediately after power is turned on. The Identify Drive command enables the host computer to receive parameter information from the hard disk drive. A parameter block consists of 256 words of data. The command requests the consecutive transfer of 256 words of data from the drive to the host computer in units of 16 bits. This parameter must to be partially modified for the controller to operate a pair of hard disk drives. Therefore, data RAM for storing 256 words of data had to be incorporated into the controller. Thus, the controller circuit structure was complicated and of increased cost.

SUMMARY OF THE INVENTION

An object of the invention is to provide a redundant disk storage system with a lower probability of simultaneous retry, thus lowering the possibility of a simultaneous data recognition failure in both of a pair of hard disk drives.

Another object of the invention is to provide a redundant disk storage system which can shorten seek time between when a read request is made for the hard disk drive and the movement of the head to a location where required data is recorded.

Another object of the invention is to provide a redundant disk storage system, with a simple structure, which can transfer data between a host computer and a hard disk drive at low cost and without having a data RAM in the controller.

The invention in the description of the preferred embodiment provides a redundant disk storage system comprising a hard disk drive device consisting of a pair of hard disk drives. A controller for controlling said hard disk drive device records data identical to data transferred from a host computer in each of said pair of hard disk drives, reads data from one of said pair of drives, and transfers read data to the host computer. The controller controls said hard disk drive device so that data identical to data transferred from said host computer is recorded at different locations on the respective magnetic disks of said pair of drives. The controller also controls said hard disk drive device so that, when recorded data is read from said pair of hard disk drives, the distance between the magnetic head positions and the magnetic disk locations for reading identical data in said pair of drives differs in the respective drives.

Advantageously, when recorded data is read from a pair of hard disk drives, since the distance between the magnetic head positions of the pair of drives and the magnetic disk locations for reading identical data differs in the respective drives, in the case where identical data is recorded at the identical location on the magnetic disks of a pair of drives, for example, data reading on one of a pair of drives can be started prior to data reading on the other drive, preventing data reading on a pair of drives from starting simultaneously. Moreover, when a retry to read data on one drive is repeated, the magnetic head in the other drive moves to the position where required data is recorded and, when said magnetic head moves to where required data is recorded, retry on one drive ends, thereby lowering the probability of a simultaneous retry on a pair of drives. Moreover, even though magnetic heads of a pair of drives are set at a relatively identical position, if identical data is recorded at different locations on the respective magnetic disks of a pair of drives, since, in one drive, for example, required data is recorded near the internal circumference on the hard disk, the probability of a retry with respect to the magnetic disk of said drive is low because required data is not recorded near the internal circumference on the magnetic disk of the other drive even though a retry is made. Therefore, the probability of a simultaneous retry in a pair of drives can be lowered.

Since data identical to data transferred from a host computer is recorded at different locations on the respective magnetic disks of a pair of hard disk drives, the recording of identical data at locations near the internal circumferences on both magnetic disks of a pair of drives can be prevented, thereby, even though data is recorded at a location near the internal circumference on the magnetic disk of one drive, enabling identical data to be recorded at a location other than near the internal circumference on the magnetic disk of the other drive and lowering the probability of a simultaneous retry on a pair of magnetic disks.

The controller of the redundant disk storage system described also sets the magnetic head of the other drive at a position other than the location where data corresponding to said data being transferred on the first magnetic disk of this drive is recorded.

The controller also records data at different locations on the respective magnetic disks of said pair of hard disk drives.

Advantageously, since the magnetic head of a drive other than that transferring data is set at a position other than the location where data corresponding to data being transferred on the magnetic disk of this drive, when the next data is read, seek time can be reduced and data read immediately.

Also, since data identical to data transferred from a host computer is recorded at different locations on the respective magnetic disks of a pair of drives, the recording of identical data at locations near the internal circumferences on both magnetic disks of a pair of drives can be prevented, thereby, even though data is recorded at a location near the internal circumference on the magnetic disk of one drive, allowing identical data to be recorded at a location other than near the internal circumference on the magnetic disk of the other drive and lowering the probability of a simultaneous retry on a pair of magnetic disks.

The controller reads parameters stored in each storage means of said pair of drives, converts read parameters to parameters based on the use of the hard disk drive device of said pair of drives recording identical data, and stores converted parameters in the storage means of either of said pair of drives. The controller then reads said converted parameter stored in one of the drives, and sends the converted parameter to a host computer, thereby controlling said hard disk drive device so that the host computer can receive parameters from it. This provides for a redundant disk storage system, with a simple structure, which can transfer data between a host computer and a hard disk drive at low cost and without having a data RAM in the controller.

According to the invention, a control means records data identical to data transferred from a host computer on a magnetic disk which is a magnetic recording medium through a magnetic head and reads data from one of a pair of hard disk drives through a magnetic disk and transfers read data to the host computer.

Here, parameters indicating a magnetic disk and a magnetic head are stored in each storage means of a pair of drives.

Then, a controller reads parameters stored in each storage means of a pair of hard disk drives, converts read parameters to parameters based on the use of the hard disk drive device of a pair of drives recording identical data, stores converted parameters in the storage means of either of a pair of drives, reads converted parameters stored in the storage means of a drive, and sends read converted parameters to a host computer, thereby controlling a hard disk drive device so that the host computer can receive parameters from it.

Thus, since parameters stored in each storage means can be converted to parameters based on the use of the hard disk drive device consisting of a pair of hard disk drives and stored in either storage means, said stored converted parameters are read and sent to a host computer, and the host computer receives said parameters device, and a storage means, RAM, for example, in a control means, needed for consecutively transferring said parameters to the host computer, can be eliminated, simplifying said controller structure.

BRIEF DESCRIPTION OF THE DRAWINGS:

FIGS. 4A and 4B are drawings showing the relationship between locations of recorded identical data when identical data is recorded at symmetrical positions with respect to the center of the radius of the hard disk;

FIGS. 5A and 5B are drawings showing the direction and distance of travel in reading the next data from the magnetic disk location when some data is read when identical data was recorded at different locations;

DETAILED DESCRIPTION OF THE PREFERRED EMBODIMENT

Figure 1:
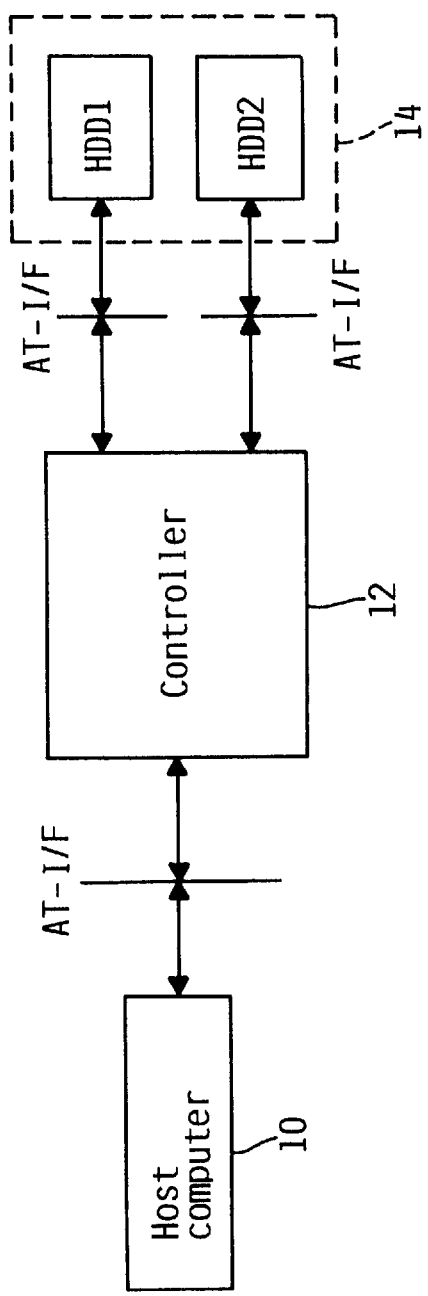
FIG. 1 is a block diagram showing a redundant disk storage system of the embodiment according to the invention.

The embodiment of the invention is explained in detail below with reference to drawings. FIG. 1 shows a block diagram of a redundant disk storage system according to the embodiment. As shown in FIG. 1, a redundant disk storage system is provided with a hard disk drive device 14 having a pair of hard disk drives (hereafter, HDD1 and HDD2). Each HDD1 and HDD2 is provided with a magnetic disk (hereafter, MD) (not shown in FIG. 1) for recording data, a magnetic head for recording on the MD and reading data recorded on the MD, and RAM for recording parameters indicating the characteristics of the MD, magnetic head, and HDDs comprising them.

Each HDD1 and HDD2 is connected to a controller 12 and a host computer 10 through an AT interface.

The controller 12 controls each HDD1 and HDD2 to record data identical to data transferred from the host computer 10 in each MD of a pair of HDD1 and HDD2. The controller 12 also controls reading of data from the MD of one HDD of the pair, and transferring read data to the host computer 10.

Figure 2:
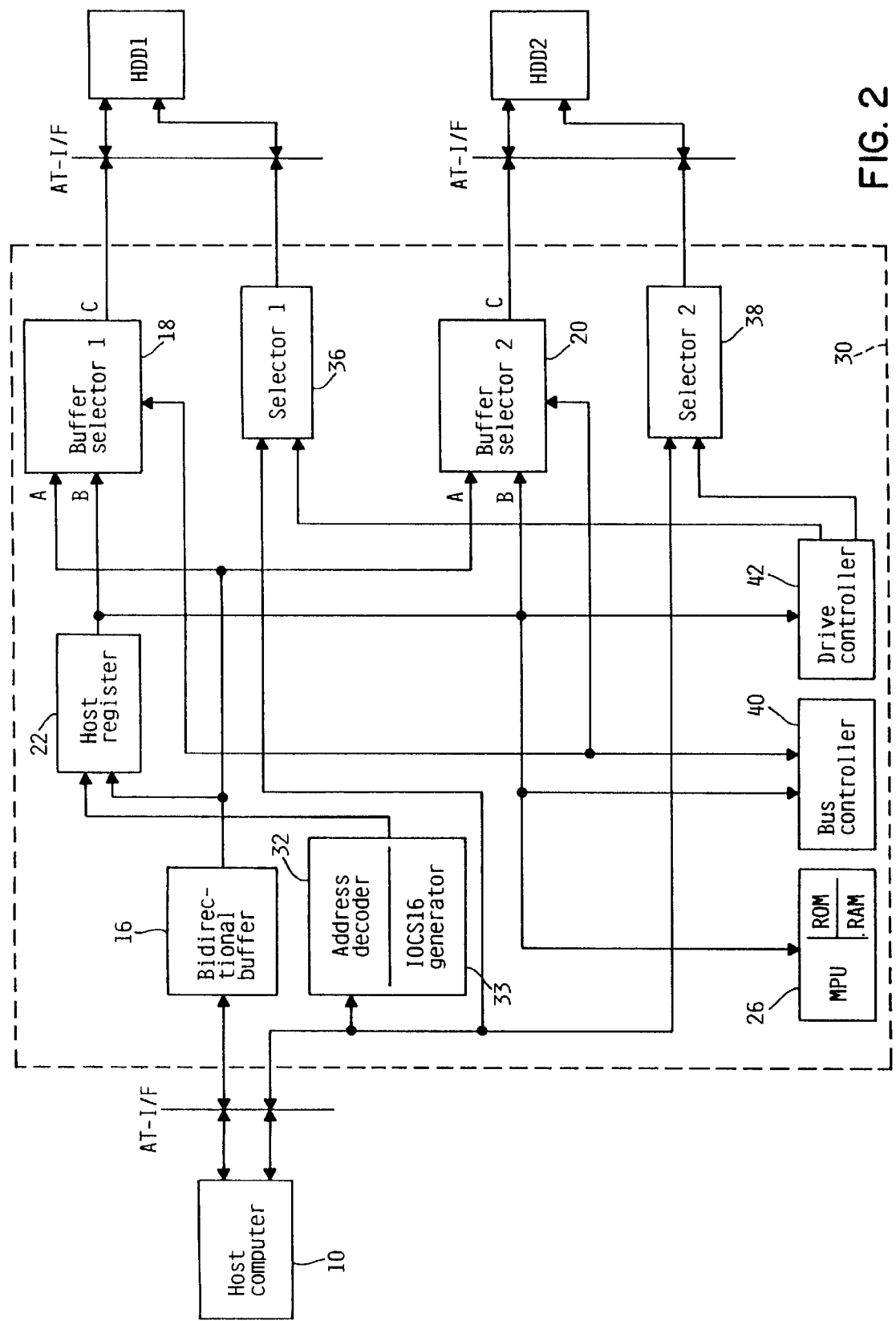
FIG. 2 is a detailed circuit diagram of a control circuit.

The controller 12 is provided with a bidirectional buffer 16 connected to a data bus of the host computer 10 through an AT interface, as shown in FIG. 2. The bidirectional buffer 16 is used to hold data temporarily when data is transferred between the host computer 10 and HDD1 and HDD2. The bidirectional buffer 16 is connected to buffer selectors 18 and 20 through terminal A. Buffer selectors 18 and 20 are connected to a host register 22 through terminal B. The host register 22 is connected to the bidirectional buffer 16. The host register 22 is used to store parameters and commands from the host computer 10.

Buffer selectors 18 and 20, connected to a bus controller 40, are used to transfer data by switching terminals A, B, and C to terminals A and C or terminals B and C based on the data transfer direction between the host computer 10 and HDD1 and HDD2 based on the signal from the bus controller 40.

The controller 12 is provided with an address decoder 32 and selectors 36 and 38. The bus for the control signal of the host computer 10 is connected to the host register 22 through an AT interface and the address decoder 32. The address decoder 32 is used to specify a write address for writing a parameter or a command from the host computer 10 to the host register 22 based on the control signal from the host computer 10. Moreover, the bus for the control signal of the host computer 10 is further connected to HDD1 and HDD2 through selectors 36 and 38 and AT interfaces. Selectors 36 and 38 are connected with a drive controller 42. The drive controller 42 is used to send a control signal for specifying a write or read address of HDD1 and HDD2 to HDD1 and HDD2 through selectors 36 and 38 when data is transferred from the host computer 10 to HDD1 and HDD2 or from HDD1 or HDD2 to the host computer 10.

The host register 22, buffer selectors 18 and 20, bus controller 40, and drive controller 42 are connected to an microprocessor unit 26, which has RAM and ROM. Buffer selectors 18 and 20 are connected to AT interfaces through terminal C. Selectors 36 and 38 are connected to AT interfaces, which are connected to HDD1 and HDD2.

Figure 3:
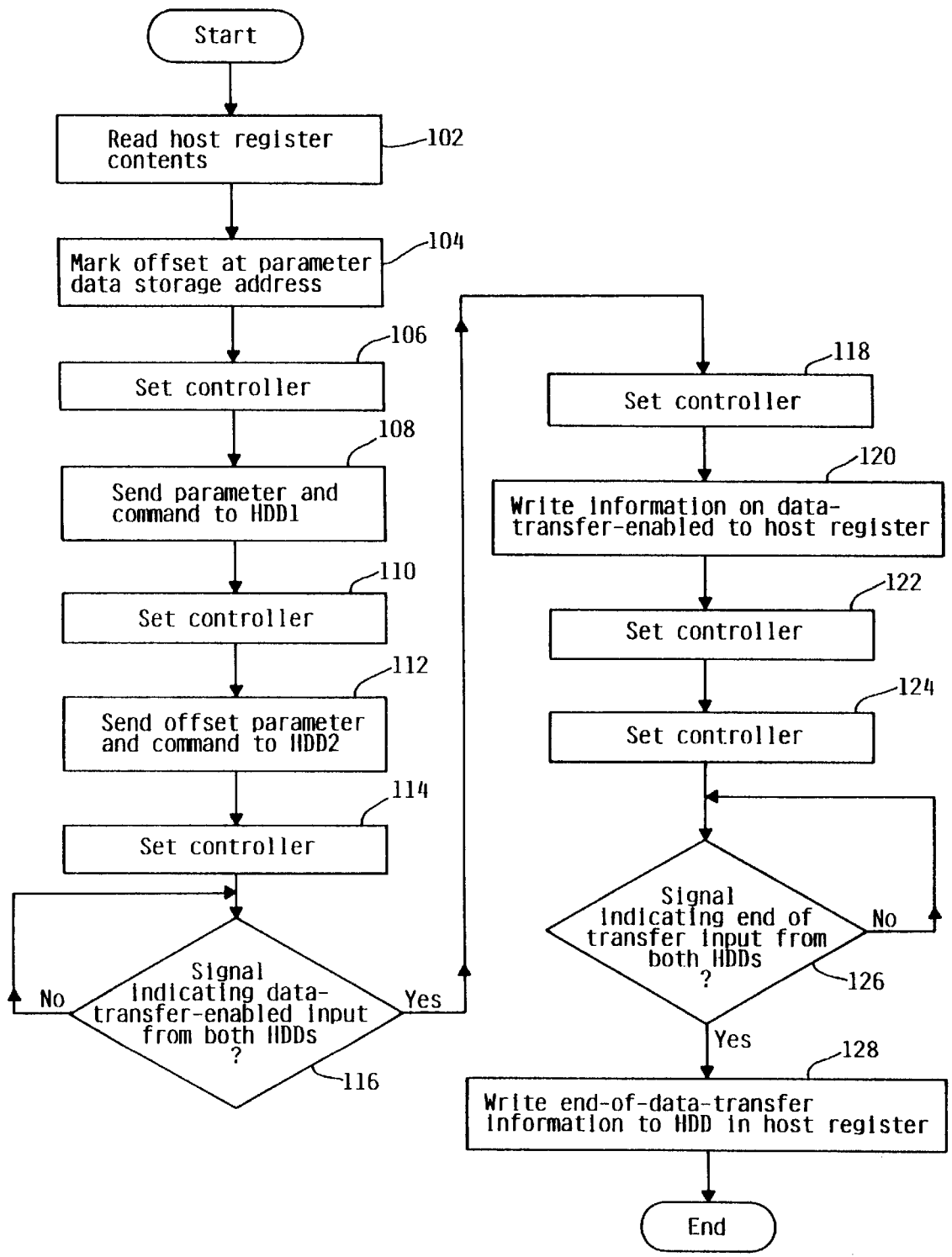
FIG. 3 is a flowchart showing the operation (data recording) of a redundant disk storage system.

The operation of a redundant disk storage system structured like the above is explained with reference to the flowchart in FIG. 3. The recording of identical data is explained first.

The host computer 10 sends a command for recording data, for example, data A, to the MDs of HDD1 and HDD2 and a parameter containing a data storage address of MD for recording data, for example, an address near the outer circumference C2 of MD to the controller 12 (FIG. 4(a). At this time, the host computer 10 sends a control signal to the address decoder 32, which sends a command and a parameter of the host computer 10 and a control signal for specifying a recording address to the host register 22. The host register 22 stores commands and parameters sent through the bidirectional buffer 16 at a location specified by a control signal of the host register 22. The host register 22 is read in step 102 and an offset is marked at the data storage address of parameters in step 104.

A method for marking an offset at the data storage address of parameters is explained below. An offset is marked at said address so that data identical to data transferred from the host computer 10 is recorded at different locations on the respective MDs of a pair of HDD1 and HDD2. As stated above, if identical data is recorded at identical locations near the internal circumference C1 of the MDs of HDD1 and HDD2, when recorded data is read, the read voltage of data read from the magnetic head is low and, even if data is read, data may not be recognized. Therefore, an offset is marked at either data storage address of parameters so that both data recording locations of MDs are not near the internal circumference. For example, an offset is marked at either data storage address of parameters so that the data storage address of the MD of one HDD and the data storage address of the MD of the other are symmetrical with respect to the center of the radius of the MD.

This will now be further explained with reference to FIGS. 4A and 4B. When the data storage address of the parameter sent from the host computer 10 is near the internal circumference C1 of the MD, an offset is not marked at the data storage address of the parameter for HDD1, but is marked only at the data storage address of the parameter for HDD2 so that it is positioned symmetrically with respect to a point near the center of the radius of the MD, that is, it comes around the outer circumference C2. Thus, when identical data is recorded, for example, the location where data A on HDD1 is recorded, is around the internal circumference C1 of MD1, and identical data; for example, the location where data A on HDD2 is recorded is around the outer circumference C2 of MD2, preventing both data recording locations from being around the internal circumference C1. Moreover, when the data storage address of the parameter sent from the host computer 10 is near the outer circumference C2 of the MD; for example, the location where data B is recorded on HDD1 is around the outer circumference C2 of MD1, and on HDD2, it is around the internal circumference C1 of MD2.

In step 106, a controller 24 is set so that the operation of the buffer selector 18 changes from B to C. In step 108, commands and parameters stored in the host register 22 are sent to HDD1 through an AT interface. At this time, the control signal for controlling HDD1 is sent from the drive controller 42 to HDD1 through the selector 36. For HDD1, the magnetic head is moved so that data is recorded at a specified location based on the sent control signal, command, and parameter.

In step 110, the controller 24 is set so that the operation of the buffer selector 20 changes from B to C. In step 112, the command stored in the host register 22 and the parameter containing the data storage address at which an offset is marked in step 104 are sent to HDD2 through an AT interface. At this time, the control signal for controlling HDD2 is sent from the drive controller 42 to HDD2 through the selector 38. For HDD2, the magnetic head is moved so that data is recorded at an offset and specified location based on the sent control signal, command, and parameter.

In step 114, the controller 24 is set so that the operations of the buffer selectors 18 and 20 changes from C to B. In step 116, it is determined whether a signal representing data-transfer-enabled, in which data can be recorded, is input from both HDD1 and HDD2. It waits until said signal is input from both HDD1 and HDD2 and, when said signal is input from both HDD1 and HDD2, in step 118, the controller 24 is set so that the operations of the buffer selectors 18 and 20 change from A to C.

In step 120, information representing data-transfer-enabled is written to the host register 22. Since the host computer 10 reads the host register 22 regularly to check whether information representing data-transfer-enabled is written to the host register 22, the host computer 10, upon finding that said information is written to the host register 22, transfers data through an AT interface. Transferred data is sent to both HDD1 and HDD2 through buffer selectors 18 and 20 and AT interfaces. Thus, HDD1 and HDD2 record data in a specified location through a magnetic head. That is, for example, HDD1 records data A near the internal circumference C1 of MD1, as shown in FIG. 4(A), and HDD2 records data A near the outer circumference C2 of MD2, as shown in FIG. 4(B).

In step 124, the controller 24 is set so that the operations of buffer selectors 18 and 20 change from C to B. In step 126, it is determined whether a signal which represents the end of data transfer is input from both HDD1 and HDD2, and waits until said signal is input, and, when said signal is input, in step 128, information representing the end of data transfer to HDD1 and HDD2 is written to the host register 22 and processing ends.

As stated above, since it is so arranged that identical data is recorded at different locations on the respective MDs of HDDs, the recording of identical data at locations near the internal circumferences on both MDs of a pair of HDDs can be prevented. Thus, even though data is recorded at a location near the internal circumference on the MD of one HDD, since identical data is recorded at a location near the outer circumference on the MD of the other HDD, the probability of reading data from the MD of the other HDD can be made high and the probability of a simultaneous retry in a pair of HDDs can be lowered, even though a retry to send a parameter and a command for reading data near the internal circumference on the MD of one HDD is repeated.

In the data recording above, an offset is marked at either data storage address so that the data storage address of the MD of one HDD and the data storage address of the MD of the other HDD are symmetrical with respect to the center of the radius of the MD, but the invention is not limited to this. An offset can also be marked at the data storage address of the MD of the other HDD so that the data storage address of the MD of the HDD is shifted for a predetermined address. Therefore, as shown in FIGS. 5A and 5B, when identical data C is recorded, for example, on HDD1, for which no offset is marked, if data is recorded near the internal circumference C1 of MD1 (FIG. 5(A)), on HDD2, an offset is marked so that the address is shifted for a predetermined address and data is recorded near the outer circumference C2 of MD2 (FIG. 5(B)). Moreover, for example, when identical data D is recorded, on HDD1, if data is recorded near the outer circumference C2 of MD1, on HDD2, the address is shifted for a predetermined address and data is recorded at a location slightly shifted toward the internal circumference C1 side from around the outer circumference C2 of MD2. Here, for example, when data D is read after data C is read, in HDD1, the magnetic head moves to a position near the outer circumference C2 from near the internal circumference C1 as it moves from C to D on MD1. Furthermore, on HDD2, the magnetic head only moves slightly to the internal circumference C1 side from near the outer circumference C2. Thus, when the reading position moves, the travel distances of the magnetic heads vary in response to it by HDD1 and HDD2. Therefore, the time from receiving a command and reading data until reading the next data is reduced.

Figure 6:
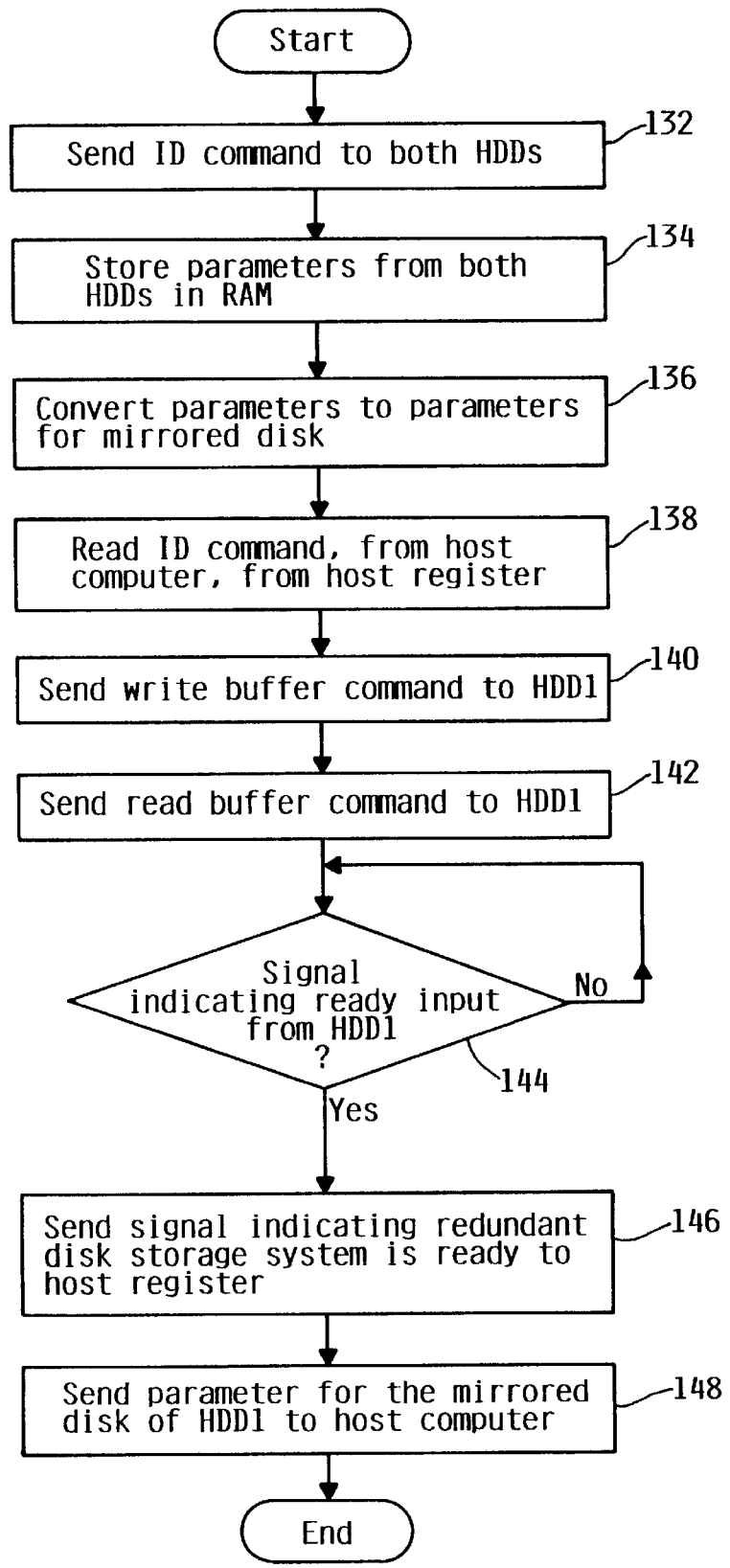
FIG. 6 is a flowchart showing initialization when an ID command is received from the host computer.

Next, reading identical data on a redundant disk storage system will be explained. The processing executed when an ID (Identity Drive) command is sent from the host computer 10 for initialization when power is turned on is explained with reference to FIG. 6. Moreover, the ID command enables the host computer 10 to receive HDD parameters. One parameter block consists of 256 words of data. It requests that 256 words be transferred consecutively from the HDD to the host computer in units of 16 bits.

When power is turned on, in step 132, the address decoder 32 sends IOCS16 (a signal to change the bit width from 8 to 16) in the address decoder 32, generated in an IOCS16 generator 33, to the host computer 10. After the controller 24 is set so that the operations of the buffer selectors 18 and 20 change from B to C, the ID command is sent to HDD1 and HDD2. In step 134, parameters from HDD1 and HDD2 are stored in RAM of an MPU 26 after the controller 24 is set so that operations of the buffer selectors 18 and 20 change from C to B. In step 136, stored parameters are changed to parameters based on the use of HDD1 and HDD2 in which identical data is recorded, that is, parameters (parameters for the mirrored disk) for recording identical data on a pair of HDD1 and HDD2.

In step 138, if an ID command is sent from the host computer 10 to the host register 22, the ID command is read from the host register and the host register 22 is made busy to make the host computer 10 wait. Then, in step 140, a write buffer command is sent to either HDD1 or HDD2 (HDD1 is chosen in this example), and the parameter, changed in step 136, for the mirrored disk is written to RAM of HDD1. In step 142, a read buffer command is sent to HDD1.

In step 144, it is determined whether a signal which represents the ready state is input from HDD1 and waits until the signal is input. When the signal is input, a signal indicating that the redundant disk storage system is ready is sent to the host register 22. Then, in step 148, the parameter, changed in step 136, for the mirrored disk is read from RAM of HDD1 and sent to the host computer at the same time and processing ends.

Thus, when parameters of HDD1 and HDD2 are converted to parameters based on use as a pair of HDDs in which identical data is recorded and a command enabling the host computer to receive parameters for the redundant disk storage system is received, RAM in the control means, needed to transfer parameters to the host computer consecutively in partial rewriting, is eliminated by the use of RAM in the HDD, simplifying the controller structure.

Moreover, since the connection of the controller to the host computer and a pair of small HDDs with a large capacity through an AT interface is possible, mirroring can be implemented even with the small HDD used in personal computers.

Moreover, since the bus for the control signal with the host computer connects the host computer and the controller through an AT interface, this can make the redundant disk storage system smaller compared to when the host computer is connected using SCSI drives and a SCSI interface.

Moreover, the structure of the bus for data transfer is arranged so that data can be transferred directly between the host computer and a HDD, but the control signal is generated by the drive controller in the controller to synchronize data transfer. Therefore, data can be transferred between HDDs without having RAM in the controller.

Figure 7:
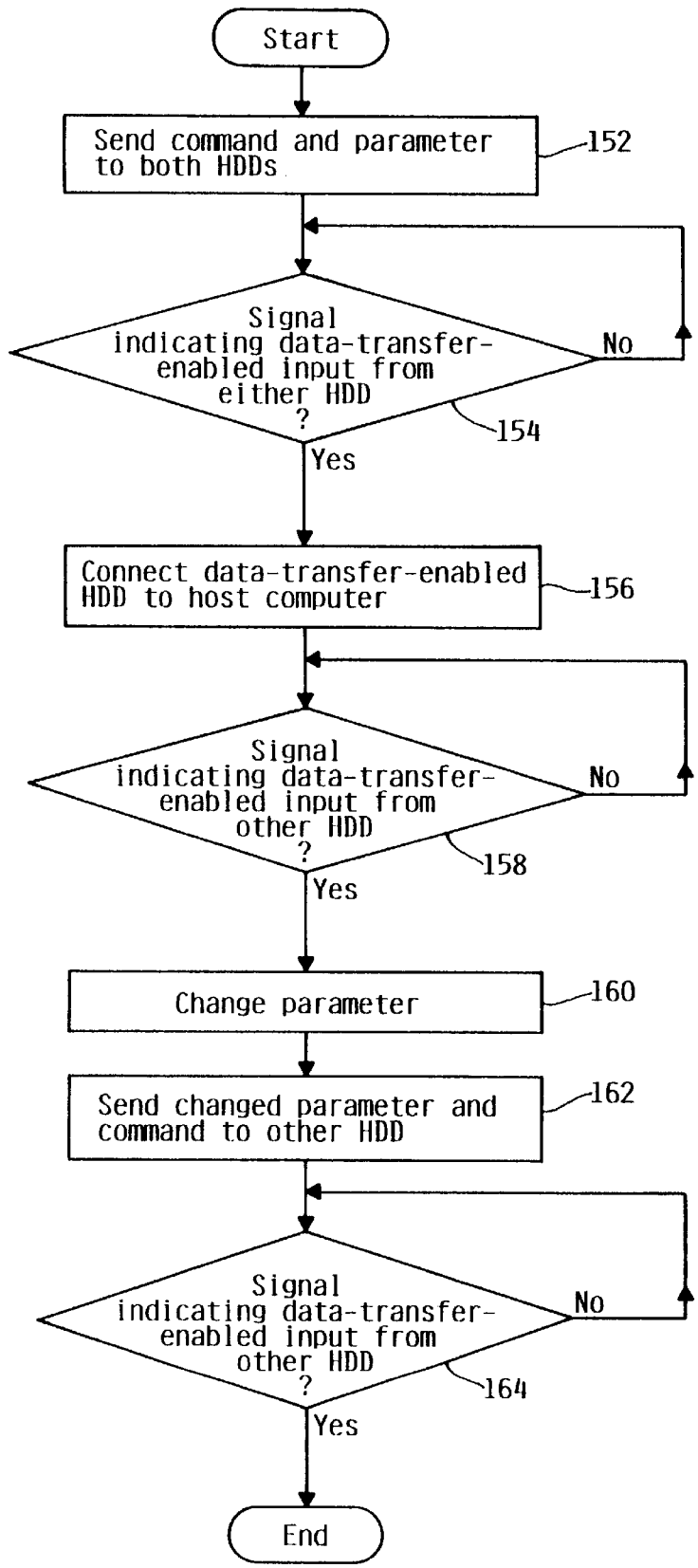
FIG. 7 is a flowchart showing the operation (data reading) of a redundant disk storage system.

Next, reading identical data on the redundant disk storage system will be explained with reference to FIGS. 7 and 8. When sending an ID command from the host computer 10 ends, a command for reading data from the host computer 10 and a parameter containing a data read address for specifying the location of data to be read on the MD of the HDD are sent.

When this command and parameter are received, in step 152, they are sent to HDD1 and HDD2 after the controller 24 is set so that operations of the buffer selectors 18 and 20 change from B to C. At this time, a control signal for controlling HDD1 and HDD2 is sent from the drive controller 42 to HDD1 and HDD2 through selectors 36 and 38.

In step 154, after the controller 24 is set so that the operations of the buffer selectors 18 and 20 change from C to B, the magnetic head of either HDD moves to the specified data read address and it is determined whether a signal which indicates data-transfer-enabled in which recorded data can be transferred to the host computer is input, and waits until the signal is input from either HDD, and, when the signal is input from either HDD, in step 156, the controller 24 is set so that, of buffer selectors 18 and 20, the operation of the buffer selector corresponding to the HDD where the signal is input changes from C to A, thereby allowing the HDD with data transfer-enabled to be connected with the host computer 10. Thus, the HDD connected with the host computer 10 transfers data of the specified address to the host computer 10.

In step 158, it is determined whether a signal representing data-transfer-enabled is input from the HDD other than that transferring data, and waits until the signal is input, and, when the signal is input, in step 160, the parameter is changed by changing the data read address in the parameter sent from the host computer 10 to another data read address. In step 162, after the controller 24 is set so that, of buffer selectors 18 and 20, the operation of buffer selector corresponding to the HDD other than that transferring data changes from B to C, in step 162, a parameter containing the changed data read address is sent to the other HDD. At this time, a control signal for controlling the other HDD is sent from the drive controller 42 to the other HDD through a responsive selector. Thus, the magnetic head position of the HDD other than that transferring data starts moving to the changed data read address.

In step 164, after the controller 24 is set so that, of buffer selectors 18 and 20, the operation of the buffer selector corresponding to the HDD other than that transferring data changes from C to B, it is determined whether a signal representing data-transfer-enabled is input from the other HDD, and waits till the signal is input, and, when it is input, processing ends.

Figure 8:
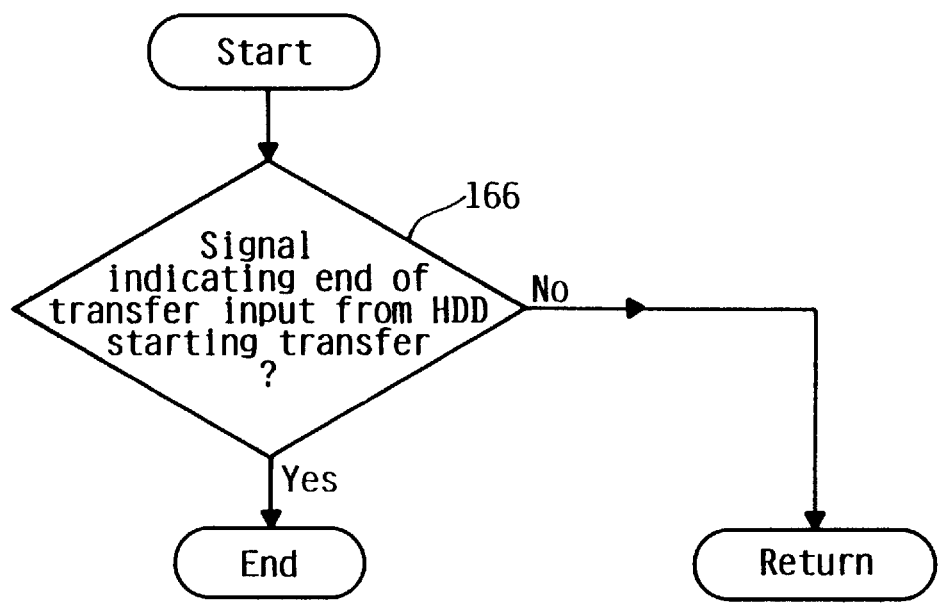
FIG. 8 is a flowchart showing the interrupt processing conducted each predetermined time when the processing of reading data from a redundant disk storage system is conducted.

Here, in step 156, after the HDD which is data-transfer-enabled is connected to the host computer, during processing from step 158 to step 164, an interrupt is made each predetermined time and the interrupt processing in FIG. 8 is conducted. That is, in step 166, it is determined whether a signal representing the end of transfer is input from the HDD which is data-transfer-enabled, and if the signal is not input, control returns as shown in the flowchart in FIG. 7, and, if the signal is input, processing terminates.

Thus, since it is so arranged that the magnetic head of the HDD other than that transferring data is set at a position other than the position where data corresponding to the data being transferred is recorded on the MD of this HDD, while data is being read from one HDD, the magnetic head in the other HDD can be set at a position other than the location where data being read is recorded, thereby shortening seek time when next data is read and allowing data to be read immediately.

In the embodiment explained above, it is so arranged that, when data identical to data transferred from the host computer is recorded at different locations on the respective MDs of a pair of HDDs and data read from one of a pair of HDDs is transferred to the host computer, the magnetic head of the HDD other than that transferring data is set at a position other than the location where data corresponding to data being transferred is recorded on the MD of this HDD, but the invention is not limited to this.

This can also be done as described in the following description. When identical data is recorded on a pair of HDDs, data identical to data transferred from the host computer is recorded in different locations on respective MDs of a pair of HDDs, and, when data read from one of a pair of HDDs is transferred to the host computer, the magnetic head of the HDD other than that transferring data can be set at a position where data corresponding to data being transferred is recorded or at the initial location on the MD of this HDD.

In this case, since data identical to data transferred from the host computer is recorded at different locations on the respective magnetic disks of a pair of HDDs, the recording of data at locations near the internal circumferences on both magnetic disks of a pair of HDDs can be prevented, thereby, even though data is recorded at a location near the internal circumference on the MD of one HDD, enabling identical data to be recorded at a location other than near the internal circumference on the MD of the other HDD and lowering the probability of a simultaneous retry in a pair of HDDs.

Advantageously, when identical data is recorded on a pair of HDDs, data identical to data transferred from the host computer is recorded at identical locations on MDs of a pair of HDDs, and, when data read from one of a pair of HDDs is transferred to the host computer, the magnetic head of the HDD other than that transferring data can be set at a position other than the location where data corresponding to data being transferred is recorded on the MD of this HDD.

In this case, since it is so arranged that the magnetic head of the HDD other than that transferring data is set at a position other than the location where data corresponding to data being transferred is recorded on the MD of this HDD, while data is being read from one HDD, the MD in the other HDD can be set at a position other than the position where data being read is recorded, thereby, when the next data is read, shortening seek time and allowing data to be read immediately.

Moreover, it can also be so arranged that, when identical data is recorded at identical locations on MDs of a pair of HDDs, when recorded data is read from a pair of HDDs, the distance between the positions of the MDs of a pair of HDDs and the MD positions for reading the identical data differ in respective HDDs.

Thus, while one HDD is repeating a retry to read data, the magnetic head on the other HDD moves to the location on the MD where required data is recorded and when said magnetic head is located at said location, the retry of one HDD ends, preventing a simultaneous retry on a pair of HDDs.

As explained above, according to the invention as set forth in claim 1, since it is so arranged that, when data is read, the distance between the magnetic head positions and the magnetic disk locations for reading identical data on a pair of hard disk drives differs in the respective drives, a pair of drives will not start reading data simultaneously, and moreover, the probability of a simultaneous retry on a pair of hard disk drives can be lowered.

Since data identical to data transferred from the host computer is recorded at different locations on the magnetic disks of a pair of hard disk drives, the recording of identical data at locations near the internal circumferences on both magnetic disks of a pair of drives can be prevented. Even though data is recorded at a location near the internal circumference on the magnetic disk of one hard disk drive, enabling identical data to be recorded at a location other than near the internal circumference on the magnetic disk of the other drive and lowering the probability of a simultaneous retry on a pair of magnetic disks.

Also, according to the invention, when the magnetic head of the hard disk drive other than that transferring data is set at a position other than the location where data corresponding to data being transferred is recorded on the magnetic disk of this hard disk drive, thereby, the next data seek is shortened considerably to allow data to be read immediately.

Furthermore, since data identical to data transferred from the host computer is recorded at different locations on the magnetic disks of a pair of hard disk drives, the recording of identical data at locations near the internal circumferences on both magnetic disks of a pair of drives can be prevented thereby, even though data is recorded at a location near the internal circumference on the magnetic disk of one hard disk drive, enabling identical data to be recorded at a location other than near the internal circumference on the magnetic disk of the other drive and lowering the probability of a simultaneous retry on a pair of magnetic disks.

The invention also makes it possible to convert parameters stored in each storage means to parameters based on the use of a hard disk drive device consisting of a pair of hard disk drives in which identical data is recorded. These converted parameters are stored in either storage means. The converted parameters are read and sent to a host computer, and the host computer receives parameters for the hard disk drive device. As a result, storage means in a control means, such as RAM, can be eliminated, allowing said controller structure to be simple and the redundant disk storage system structure to be simple and manufactured at low cost.

What is claimed is:

1. A method for recording identical data to a first disk drive and a second disk drive, each of said first and second disk drives each having at least one head for reading and recording data; and having at least one disk, said method comprising the steps of:

recording said identical data in the first disk drive at a first radial location; and recording said identical data in the second disk drive at a second radial location, the first and second radial locations being at different distances from the outer edge of the respective disk in the disk drive such that the first radial location is located a distance from the center of the first radius in a first direction towards the inner circumference of the first disk drive and the second radial location is located said distance from the center of the second radius in a second direction towards the outer circumference of the second disk drive.

2. The method of claim 1 further comprising the steps of controlling the head of the second disk drive so that, while data is read from the first disk drive, the head of the second disk drive is set at a position other than that where the identical data corresponding to said data being transferred, is recorded on the second disk drive.

3. The method of claim 1 wherein each of said first and second disk drives each has a storage means, said storage means of said first disk drive for storing parameters indicating at least a first address, a first command, a first control signal, a first disk and a first head, said method further comprising the steps of:

reading the parameters stored in the storage means of each of said pair of disk drives;

converting said read parameters to parameters which indicate a second address, an offset, a second command, a second control signal, the other of said pair of disk drives, and a second head for recording identical data;

storing said converted parameters in the storage means of the other of said pair of disk drives;

reading said converted parameters stored in the storage means of the other of said disk drives; and sending said read, converted parameters to a host computer, so that the host computer receives one set of parameters from said first and second disk drives.

4. A redundant disk storage system for storing and retrieving data from a host computer comprising:
   a first disk drive;
   a second disk drive, each of said first and second disk drives further comprising:
   at least one circular disk having a medium for recording data; and
   a head assembly for recording data to, and reading data from, said disk; and
   a controller for controlling said redundant disk storage system, said controller controlling the transfer of data between the host computer and said first and second disk drives; said controller controlling the reading of stored data from said first and second disk drives;
   said controller controlling the recording of data to said first and second disk drives, to record data identical to data transferred from a host computer on each of said first and second disk drives, the data recorded on said first disk drive at a first location determined by an offset from the center of the radius of its respective circular disk in a first direction along its radius and the identical data is recorded on said second disk drive at a second location determined by said offset from the center of the radius of its respective circular disk in a second direction opposite said first direction along its radius.

5. The redundant disk storage system for storing and retrieving data from a host computer having a controller of claim 4 further comprising means for controlling the head assembly of said first drive and the head assembly of said second drive so that the distance between the head assembly and the data in the first drive is different than the distance between the head assembly and the data in the second drive.

6. A redundant disk storage system comprising:
   a pair of disk drives each having a circular disk which has a recording medium thereon for recording data at a data storage address; and each of said pair of disk drives having a head assembly which includes a head for recording and reading data on said disk; and
   a controller for controlling said redundant disk storage system to record data identical to data transferred from a host computer in each of said pair of disk drives so that the data storage address of the data on a first disk drive of said pair of disk drives is at a distance from the center of the radius of its respective circular disk in a first direction and the data storage address of the identical data on a second disk drive of said pair of disk drives is at said distance from the center of the radius of its respective circular disk in a second direction opposite said first direction, reading data from one of said pair of drives, and transferring read data to the host computer;
   said controller controlling said redundant disk storage system so that, while data read from one of said pair of disk drives is being transferred to said host computer, the head of the other of said pair of disk drives is set at a position other than that where the identical data corresponding to said data being transferred, is recorded.

7. A redundant disk storage system comprising:
   a pair of disk drives each having a disk which has a recording medium for recording data, each of said pair of disk drives further comprising a head assembly for recording and reading data recorded on said disk, and each of said pair of disk drives further comprising a storage means for storing parameters, said storage means of one of said pairs of disk drives indicating at least a first address, a first command, a first control signal, a first disk and a first head; and
   a controller for controlling said redundant disk storage system to record data identical to data transferred from a host computer in each of said pair of disk drives, read data from one of said pair of drives, and transfer read data to the host computer, said controller further comprising,
   means for reading the parameters stored in the storage means of each of said pair of disk drives;
   means for converting said read parameters to parameters which indicate a second address, an offset, a second command, a second control signal, the other of said pair of disk drives, and a second head for recording identical data, the offset marked at either address so that the first address is the address of the data on one of said pair of disk drives and the second address is the address of the identical data on the other of said pair of disk drives and the offset determines that first address and the second address are located the same distance but in opposite directions from the center of each respective radius of each respective disk of said disk drives;
   means for storing said converted parameters in the storage means of the other of said pair of disk drives;
   means for reading said converted parameters stored in the storage means of the other of said pair of disk drives; and
   means for sending said read, converted parameters to a host computer.

8. A method for recording identical data to a first disk drive and a second disk drive, each of said first and second disk drives each having at least one head for reading and recording data, each of said disk drives including a storage means for storing parameters indicating said disk and said head, an address, a command, a control signal, said method comprising the steps of:
   reading the parameters stored in the storage means of each of said at least two disk drives;
   converting said read parameters to parameters which indicate a second address, an offset, a second command, a second control signal, the other of said pair of disk drives, and said second head for recording identical data, the offset marked at either address so that the first address is the address of the data on one of said pair of disk drives at a first distance determined by an offset from the center of the radius of the first disk drive and the second address is the address of the identical data at a second distance determined by said offset and in an opposite direction from the center of the radius of the second disk drive;
   storing said converted parameters in the storage means of the other of said at least two drives;
   reading said converted parameters stored in the storage means of the other of said at least two disk drives; and
   sending said read, converted parameters to a host computer, so that the host computer receives one set of parameters from said at least two disk drives.

9. A redundant disk storage system for storing and retrieving data from a host computer comprising:
   a first disk drive;
   a second disk drive, each of said first and second disk drives further comprising:
   at least one disk having a medium for recording data; and a head assembly for recording data to, and reading data from, said disk;

a controller for controlling said redundant disk storage system, said controller controlling the transfer of data between the host computer and said first and second disk drives; said controller controlling the reading of stored data from said first and second disk drives; said controller controlling the recording of data to said first and second disk drives data identical to data transferred from a host computer is recorded on each of said first and second disk drives at different radial locations on the respective disks of said first and second disk drives such that the radial location of the disk of the first disk drive is located at an offset from the center of the radius of said disk of said first disk drive in a first direction and the radial location of the disk of the second disk drive is located at said offset from the center of the radius of said disk of said second disk drive in a second direction opposite said first direction; and means for controlling the head assembly of said first drive and the head assembly of said second drive so that the distance between the head assembly and the data in the first drive is different than the distance between the head assembly and the data in the second drive.

10. A method for recording identical data to a first disk drive and a second disk drive, each of said first and second disk drives each having at least one head for reading and recording data; and having at least one disk, said method comprising the steps of:

recording said identical data in the first disk drive at a first radial location on a first radius; and recording said identical data in the second disk drive at a second radial location on a second radius, the first and second radial locations being at different distances from the outer edge of the respective disk in the disk drive such that the first radial location is displaced distance x from the center of the first radius towards the outer edge of the first disk and the second radial location is displaced distance x from the center of the second radius towards an inner edge of the second disk.

* * * * *